(12) United States Patent
Peng et al.

(10) Patent No.: US 12,317,698 B2
(45) Date of Patent: May 27, 2025

(54) DISPLAY PANEL AND DISPLAY DEVICE

(71) Applicant: WUHAN TIANMA MICROELECTRONICS CO., LTD., Wuhan (CN)

(72) Inventors: Chao Peng, Wuhan (CN); Chujie Yu, Wuhan (CN); Zhongjie Zhang, Shanghai (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 451 days.

(21) Appl. No.: 18/053,434

(22) Filed: Nov. 8, 2022

(65) Prior Publication Data

US 2023/0063580 A1    Mar. 2, 2023

(30) Foreign Application Priority Data

Jun. 28, 2022   (CN) .......................... 202210752347.6

(51) Int. Cl.
*H10K 59/124* (2023.01)
*H10K 59/131* (2023.01)
*H10K 59/82* (2023.01)

(52) U.S. Cl.
CPC ......... *H10K 59/124* (2023.02); *H10K 59/131* (2023.02); *H10K 59/82* (2023.02)

(58) Field of Classification Search
None
See application file for complete search history.

(56) References Cited

U.S. PATENT DOCUMENTS

| | | | |
|---|---|---|---|
| 11,257,868 B2 * | 2/2022 | Xiao | H10K 71/00 |
| 11,552,271 B2 * | 1/2023 | Sun | H10K 50/822 |
| 2013/0032802 A1 * | 2/2013 | Kim | H10D 86/60 |
| | | | 438/34 |
| 2016/0358937 A1 * | 12/2016 | Qu | H10D 86/0231 |
| 2018/0145119 A1 * | 5/2018 | Choi | H10K 59/124 |
| 2021/0280660 A1 * | 9/2021 | Chen | H10D 86/411 |
| 2021/0305339 A1 * | 9/2021 | Li | H10K 59/123 |
| 2022/0130930 A1 * | 4/2022 | Yang | H10K 59/124 |

FOREIGN PATENT DOCUMENTS

| | | |
|---|---|---|
| CN | 110137238 A | 8/2019 |
| CN | 110911466 A | 3/2020 |
| CN | 113388809 A | 9/2021 |

* cited by examiner

*Primary Examiner* — Scott B Geyer
(74) *Attorney, Agent, or Firm* — CHRISTENSENT O'CONNOR JOHNSON KINDNESS PLLC

(57) ABSTRACT

A display panel including a substrate, a metal structure at side of substrate, and first insulating layer, the metal structure and the first insulating layer located on a non-display region, the first insulating layer has hollow region, the hollow region extends through the first insulating layer in direction perpendicular to plane of substrate, where the metal structure includes first portion and second portion that are connected to each other. the first portion overlaps a hollow region and the second portion overlaps first insulating layer. The maximum distance between a part of a surface of a side of first portion away from substrate and substrate is a first distance, the maximum distance between a surface of a side of second portion away from the substrate and the substrate is a second distance, and the first distance is greater than the second distance.

22 Claims, 6 Drawing Sheets

DISPLAY PANEL AND DISPLAY DEVICE

CROSS REFERENCE TO RELATED APPLICATIONS

The present application claims priority to Chinese Patent Application No. CN 202210752347.6, filed on Jun. 28, 2022, the content of which is incorporated herein by reference in its entirety.

TECHNICAL FIELD

The present disclosure relates to the field of display technologies, and in particular, to a display panel and a display device.

BACKGROUND

With advantages such as self-emission, fast response, wide viewing angle, low cost, simple manufacturing process, good resolution, and high brightness, Organic Light-Emitting Diodes (OLEDs) can meet consumer's new requirements for display products. During the manufacture of OLED display panels, the evaporation process is an extremely important and critical technique, which typically utilizes a mask as a mold. For example, an organic material is volatilized at high temperature and then deposited on a substrate in the form of a desired pattern of material molecules through a stencil on the mask to form an organic light emitting layer in the OLED. The prior art has problems that the electrostatic discharge (ESD) damages the substrate in the evaporation process.

SUMMARY

Embodiments of the present disclosure provide a display panel and a display device to solve the problem of ESD damage to a substrate during an evaporation process.

In a first aspect, embodiments of the present disclosure provide a display panel including a display region and a non-display region. The display panel includes a substrate, a metal structure at a side of the substrate, and a first insulating layer, the metal structure and the first insulating layer being on the non-display region, the first insulating layer being at a side of the metal structure away from the substrate. The first insulating layer has a hollow region penetrating the first insulating layer in a direction perpendicular to a plane of the substrate; the metal structure includes a first portion and a second portion that are connected to each other; and in the direction perpendicular to the plane of the substrate, the first portion overlaps the hollow region and the second portion overlaps the first insulating layer. In the direction perpendicular to the plane of the substrate, a maximum distance between a surface of a side of at least a part of the first portion away from the substrate and the substrate is a first distance, a maximum distance between a surface of a side of the second portion away from the substrate and the substrate is a second distance, and the first distance is greater than the second distance.

In a second aspect, based on the same inventive concept, embodiments of the present disclosure further provide a display device including a display panel, wherein the display panel comprises a display region and a non-display region, the display panel comprises a substrate, a metal structure at a side of the substrate, and a first insulating layer, wherein the metal structure and the first insulating layer are located on the non-display region, and the first insulating layer is located at a side of the metal structure away from the substrate, the first insulating layer has a hollow region penetrating the first insulating layer in a direction perpendicular to a plane of the substrate; the metal structure comprises a first portion and a second portion that are connected to each other; and in the direction perpendicular to the plane of the substrate, the first portion overlaps the hollow region and the second portion overlaps the first insulating layer, and in the direction perpendicular to the plane of the substrate, a maximum distance between a surface of a side of at least part of the first portion away from of the substrate and the substrate is a first distance, a maximum distance between a surface of a side of the second portion away from the substrate and the substrate is a second distance, and the first distance is greater than the second distance.

BRIEF DESCRIPTION OF DRAWINGS

In order to more clearly explain the embodiments of the present disclosure or the technical solution in the related art, the drawings used in the description of the embodiments or the related art will be briefly described below. The drawings in the following description are some embodiments of the present disclosure. Those skilled in the art can obtain other drawings based on these drawings.

DETAILED DESCRIPTION

Figure 1:
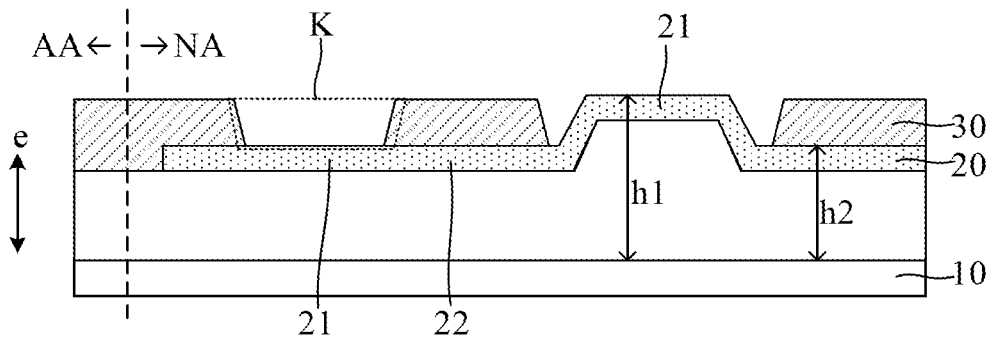
FIG. 1 is a schematic diagram of a display panel according to an embodiment of the present disclosure.

In order to better understand technical solutions of the present disclosure, the embodiments of the present disclosure are described in detail with reference to the drawings. It should be clear that the described embodiments are merely part of the embodiments of the present disclosure rather than all of the embodiments. It is obvious for those skilled in the art that other embodiments made based on the embodiments of the present disclosure fall within the protection scope of the present disclosure.

The terms used in the embodiments of the present disclosure are merely for the purpose of describing specific embodiment, rather than limiting the present disclosure. The terms "a", "an", "the", and "said" in a singular form in the embodiments of the present disclosure and the attached claims are also intended to include plural forms thereof, unless noted otherwise.

It is obvious for those skilled in the art that various modifications and changes may be made to the present disclosure without departing from the spirit or scope of the present disclosure. Therefore, the present disclosure is intended to cover the modifications and changes on the present disclosure that fall within the range of the corresponding claims (technical solutions claimed) and equivalents thereof.

It should be noted that, the implementations provided in the embodiments of the present disclosure can be combined with each other if no conflict occurs.

Conventionally, the mask is attached to the substrate to be evaporated in the process of evaporating the organic layer. The mask is separated from the substrate after the evaporation process, and the mask is highly susceptible to static electricity when separated from the substrate. There are 10 or more layers of film on the substrate required to be fabricated in the evaporation process. After each layer of film is evaporated, the mask and the substrate are subjected to a separation process, and the continuous attachment and separation of the mask and the substrate results in a continuous accumulation of electrostatic charge, which is released between the mask and the substrate after a certain amount of charge has accumulated, resulting in ESD damage to the product.

In some embodiments of this disclosure, there is an electrode contact area in the non-display region, a metal structure is disposed in the electrode contact area, and the metal structure can serve as a power structure for the common electrode, and the common electrode extending from the display region to the non-display region is in contact with the metal structure. The metal structure of the electrode contact area is usually disposed in the direction around the display region, the area of the metal structure is large, and the capacitor is formed by the overlap of the metal structure and the mask when the mask is attached to the substrate. The large amount of electrostatic charge accumulated during the continuous attach and detach of the mask to the substrate can cause the metal structure in the non-display region to be severely damaged if the electrostatic discharge occurs in the area where the metal structure overlaps the mask. When the metal structure in the non-display region is hit, a crack is generated, and the crack extends from the non-display region toward the display region, resulting in package reliability degradation, which severely affects the display panel lifetime. Therefore, how to prevent the ESD damage to the film structure of the non-display region during the evaporation process to improve the packaging reliability is a significant problem.

In order to solve the problems of the related art, embodiments of the present disclosure provide a display panel to improve the structure of the film layer in the non-display region, increase the height of the metal structure at the position of the portion, decrease the vertical distance between the metal structure and the mask at a higher position in the evaporation process, more charges can be stored or the static dissipation can be performed quickly, reduce the risk of the static discharge, prevent cracks after the metal structure is hit, and improve the reliability of the package.

FIG. 1 is a display panel including a display region AA and a non-display region NA.

The display panel includes a substrate 10, a metal structure 20 at a side of the substrate 10, and a first insulating layer 30, the metal structure 20 and the first insulating layer 30 being at a non-display region, the first insulating layer 30 being at a side of the metal structure 20 away from the substrate 10.

In some embodiments, the first insulating layer 30 has a hollow region K penetrating the first insulating layer 30 in a direction e perpendicular to a plane of the substrate 10; the metal structure 20 includes a first portion 21 and a second portion 22 that are connected to each other; and the first portion 21 overlaps the hollow region K and the second portion 22 overlaps the first insulating layer 30 in the direction e perpendicular to the plane of the substrate 10. In other words, the hollow region K exposes the first portion 21, and the second portion 22 is covered by the first insulating layer 30. where In the direction e perpendicular to the plane of the substrate 10, a maximum distance between at least part of the surface of a side of the first portion 21 away from the substrate 10 and the substrate 10 is a first distance h1, a maximum distance between the part of the surface of the side of the second portion 22 away from the substrate 10 and the substrate 10 is a second distance h2, and the first distance h1 is greater than the second distance h2. In other words, a vertical distance between at least a part of the surface of the first portion 21 away from the side of the substrate 10 and the substrate 10 that is greater than a vertical distance between the surface of the second portion 22 away from the side of the substrate 10 and the substrate 10 In other words, the height of at least a part of the first portion 21 relative to the substrate 10 is greater than the height of the second portion 22 relative to the substrate 10 based on the plane of the substrate 10.

In the display panel provided by the embodiment of the present disclosure, the non-display region NA includes the metal structure 20, the first portion 21 of the metal structure 20 is exposed by the hollow region K of the first insulating layer 30, the second portion 22 of the metal structure 20 is covered by the first insulating layer 30, and a vertical distance between a surface of at least a part of the first portion 21 away from the side of the substrate 10 and the substrate 10 is larger than a vertical distance between a surface of a part of the second portion 22 away from the side of the substrate 10 and the substrate 10 is equal to increasing a height of the part of the first portion 21. In the evaporation process of the display panel fabrication, the mask is attached to the panel to be evaporated, and since the height of at least a part of the first portion 21 is increased, for example, the vertical distance between the part of the first portion 21 and the mask becomes smaller, and the capacitance formed by the overlapping of the mask and the metal structure 20 is increased. When the capacitance formed between the mask and the metal structure 20 becomes large, the amount of charges capable of being stored in the capacitor becomes large, and the charges generated during attaching and detaching the mask to the panel to be evaporated are stored in the large capacitor, so that ESD damage can be reduced, and the electrostatic discharge can be prevented from hitting the metal structure 20. Extension of the metal structure 20 to the display region AA due to crack damage can also be avoided, thereby improving package reliability.

Figure 2:
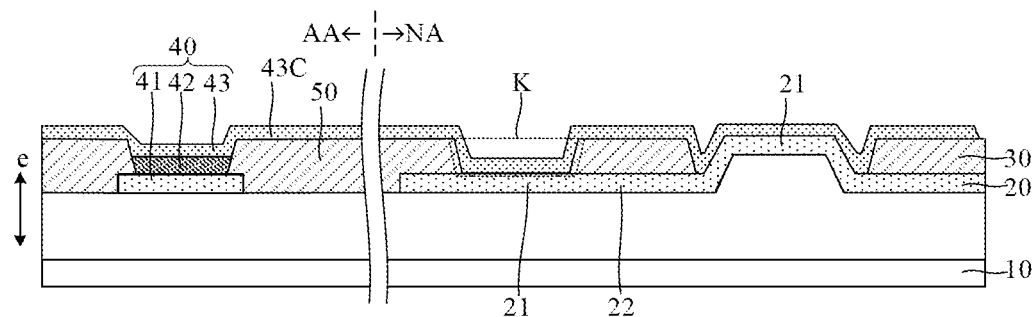
FIG. 2 is another schematic diagram of a display panel according to an embodiment of the present disclosure.

In some embodiments, as shown in FIG. 2, the display region AA includes light emitting devices 40 and pixel defining layers 50 that are that are located at a side of the substrate 10. The pixel defining layers 50 each are configured to separate two of the light emitting devices 40 that are adjacent to one another. The light emitting devices 40 each include a first electrode 41, a light emitting layer 42, and a second electrode 43 that are stacked, and the second electrodes 43 of the light emitting devices 40 are interconnected to form a common electrode 43C. The common electrode 43C extends from the display region AA to the non-display region NA, and the common electrode 43C in the hollow region K is in contact with the first portion 21. Optionally, the first electrode 41 is a reflective anode, the second electrode 43 is a transmissive cathode, and the light-emitting layer 42 includes at least a light-emitting material layer. In this embodiment, the area of the metal structure 20 is an electrode contact area, the common electrode 43C is in contact with the metal structure 20 in the electrode contact area, and the metal structure 20 in the non-display region NA can serve as a power supply structure for the common electrode 43C. Providing the metal structure 20 along the first direction surrounding the display region AA can improve the uniformity of the voltage signal on the second electrode 43 at various positions within the display region AA.

Alternatively, the common electrode 43C is formed by a sputtering process, and the organic layer in the light emitting device 40 is formed by an evaporation process before the common electrode 43C. Organic layers formed by an evaporation process include at least light-emitting material layers, hole transport layers, hole injection layers, electron transport layers, electron injection layers, and the like. So that the common electrode 43C is not covered by the hollow region K of the first insulating layer 30 in the non-display region NA in the evaporation process, the hollow region K of the first insulating layer 30 is opposite to the non-open area on the mask in the evaporation process. The mask is made of a metal material, and the mask and the exposed first portion 21 of the hollow region K are overlapped with each other, and electrostatic discharge damage to the first portion 21 is easily generated. With the design of the present disclosure, increasing the height of at least a part of the first portion 21 such that when the hollow region K of the first insulating layer 30 is opposite to the non-opening area of the mask, the vertical distance between the first portion 21 and the mask is smaller, the capacitance formed therebetween is increased, and ESD damage is reduced and ESD damage to the metal structure 20 is prevented. Extension of the metal structure 20 to the display region AA due to crack damage can also be avoided, thereby improving package reliability.

The metal structure 20 is disposed in the same layer as the first electrode 41. That is, the metal structure 20 and the first electrode 41 are made in the same manufacturing process.

In some embodiments, the material of the first insulating layer 30 is an organic material. Alternatively, the material of the first insulating layer 30 is the same as that of the pixel defining layer 50. The first insulating layer 30 is disposed in a same layer as the pixel defining layer 50.

Figure 3:
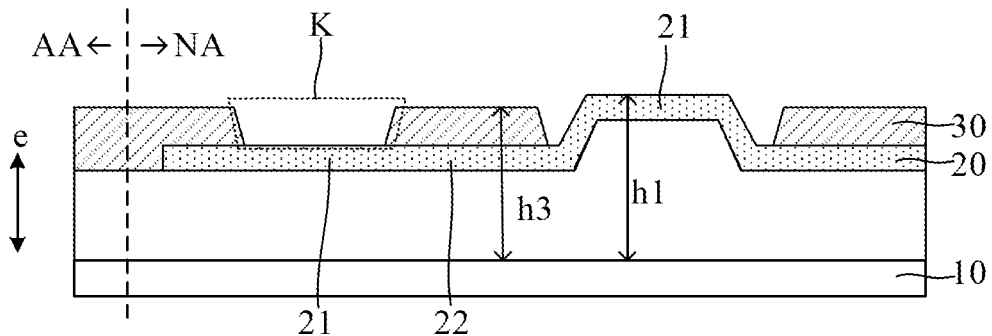
FIG. 3 is another schematic diagram of a display panel according to an embodiment of the present disclosure.

In some embodiments, FIG. 3 is a schematic diagram of another display panel provided by the embodiment of the present disclosures. As shown in FIG. 3, a maximum distance between the surface of a side of the first insulating layer 30 away from the substrate 10 and the substrate 10 in the direction e perpendicular to the plane of the substrate 10 is a third distance h3, and the first distance h1 is greater than the third distance h3. That is, the height of at least a part of the first portion 21 is greater than the height of the first insulating layer 30 in view of the plane of the substrate 10. In some embodiments, the vertical distance between the part of the first portion 21 and the mask during the evaporation process can be reduced, so that the capacitance formed by the overlap of the mask and the metal structure 20 is increased, and thus the amount of charge the capacitance can store is increased, the risk of ESD can be reduced, and the ESD damage of the metal structure 20 is prevented.

In some other embodiments, after the height of the part of the first portion 21 is increased, the part of the first portion 21 with a greater height can be in contact with the mask during the evaporation process, and the first insulating layer 30 with a smaller height is not in contact with the mask, which shows that the metal film layer in the panel is in contact with the mask made of the metal material. In one aspect, the contact area between the non-metal film layer and the mask in the panel to be evaporated can be reduced, and the static electricity generated by separating the mask from the panel to be evaporated can be reduced. On the other hand, the first portion 21 with the larger height is in contact with the mask, and the static electricity on the metal structure 20 can be introduced onto the mask through the first portion 21 in contact with the mask, thereby guiding the static electricity on the panel away and preventing the large accumulation of static charges on the panel, which can also reduce the risk of static discharge in the evaporation process.

Figure 4:
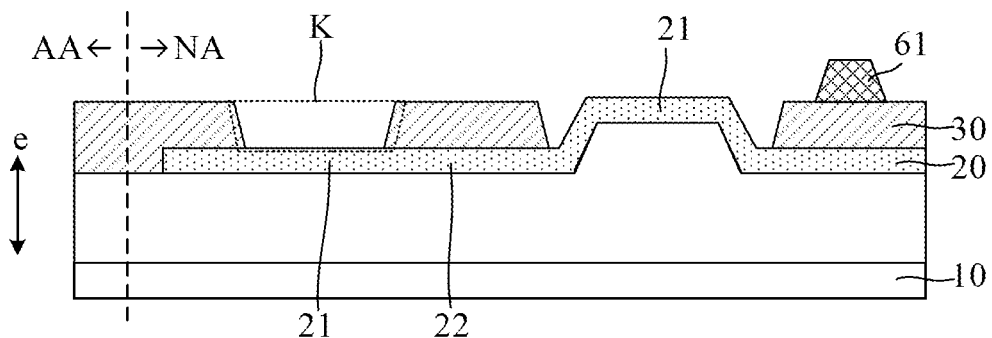
FIG. 4 is another schematic diagram of a display panel according to an embodiment of the present disclosure.

In some embodiments, as shown in FIG. 4, the non-display region NA includes a first support column 61 at a side of the first insulating layer 30 away from the substrate 10, and the first support column 61 is in contact with the first insulating layer 30. The display panel provided in this embodiment can be used to support the mask in the non-display region NA during the evaporation process, so that the contact area between the mask and the non-display region NA of the panel to be evaporated during the evaporation process can be reduced. In this way, the static electricity generated by contact friction separation between the mask and the panel to be evaporated during the evaporation process can be reduced, and the amount of charges accumulated by the mask and the panel to be evaporated undergoing multiple attachment and separation processes can be reduced, so that ESD damage can be reduced, and the electrostatic discharge hitting metal structure 20 can be prevented.

Figure 5:
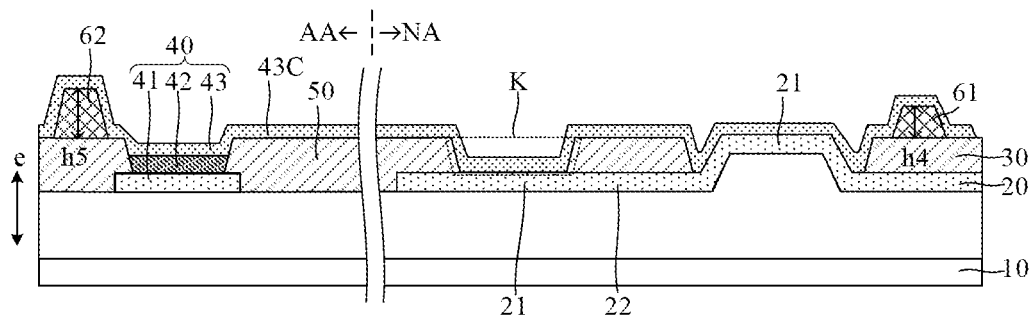
FIG. 5 is another schematic diagram of a display panel according to an embodiment of the present disclosure.

In some embodiments, as shown in FIG. 5, the display region AA includes a pixel defining layer 50 at a side of the substrate 10 and a second support column 62 at a side of the pixel defining layer 50 away from the substrate 10, and the height h4 of the first support column 61 is smaller than the height h5 of the second support column 62 in a direction e perpendicular to the plane of the substrate 10. It can be seen from FIG. 5 that the common electrode 43C is located at a side of the support column away from the substrate 10, that is, the common electrode 43C is fabricated after the first support column 61 and the second support column 62. Alternatively, the materials of the first support column 61 and the second support column 62 are the same. In the fabrication, the support columns having the same height are fabricated first, and then the support columns in the non-display region NA are subjected to thickness thinning to form the first support columns 61 having a smaller height. In the process of evaporating the organic layer, the second support column 62 supports the mask opposite to the display region AA, and can ensure the uniformity of the evaporation of the organic material in the display region AA. In the evaporation process, the first support column 61 supports the mask opposite to the non-display region NA, is capable of reducing the contact area between the mask and the non-display region NA of the panel to be evaporated in the evaporation process, reducing the electrostatic generated by the rubbing separation between the mask and the panel to be evaporated in contact, and is capable of reducing the amount of charges accumulated between the mask and the panel to be evaporated through multiple attachment and separation processes, thereby reducing ESD damage.

In some embodiments, by performing the thickness thinning process on the support columns in the non-display region NA to form the first support column 61 with a smaller height, the height difference between the first portion 21 and the first support column 61 with an increased height can be reduced, and a design in which the first portion 21 and the first support column 61 with an increased height are substantially equal to each other is easily achieved.

In some embodiments, at least a part of the surface of the first portion 21 facing away from the side of the substrate 10 has a vertical distance from the substrate 10 equal to a vertical distance from the substrate 10 of the surface of the first support column 61 facing away from the side of the substrate 10, so that at least a part of the first portion 21 contacts the mask during the evaporation process. In one aspect, the contact area between the non-metal film layer and the mask in the panel to be evaporated can be reduced, and the static electricity generated by separating the mask from the panel to be evaporated can be reduced. On the other hand, the static electricity on the metal structure 20 can be introduced onto the mask through the first portion 21 in contact with the mask, thereby conducting the static electricity away from the panel, preventing the large accumulation of static charges on the panel, and thus the risk of static discharge in the evaporation process can be reduced.

Figure 6:
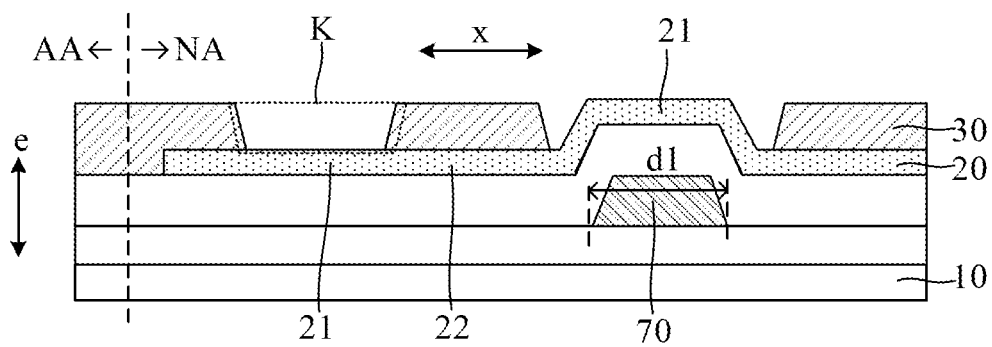
FIG. 6 is another schematic diagram of a display panel according to an embodiment of the present disclosure.

In some embodiments, as shown in FIG. 6, the non-display region NA further includes a pad structure 70 disposed between the substrate 10 and the metal structure 20; at least a part of the first portion 21 overlaps the pad structure 70 in a direction e perpendicular to the plane of the substrate 10, and an orthogonal projection of the part of the first portion 21 on the substrate 10 covers an orthogonal projection of the pad structure 70 on the substrate 10. The pad structure 70 overlapping with the first portion 21 can pad the first portion 21 to increase the vertical distance between the surface of the first portion 21 away from the side of the substrate 10 and the substrate 10. The pad structure 70 is disposed such that the vertical distance between the first portion 21 and the mask during the evaporation process becomes smaller, and the capacitor formed by the mask overlapping with the metal structure 20 is increased. In this way, the amount of charge the capacitor can store is increased, and ESD damage can be reduced, and ESD damage to the metal structure 20 is prevented.

As shown in FIG. 6, the pad structure 70 does not overlap with the first insulating layer 30 in the direction e perpendicular to the plane of the substrate 10. This allows the pad structure 70 to only pad the first portion 21, and prevents the pad structure 70 from padding a part of the first insulating layer 30.

Figure 7:
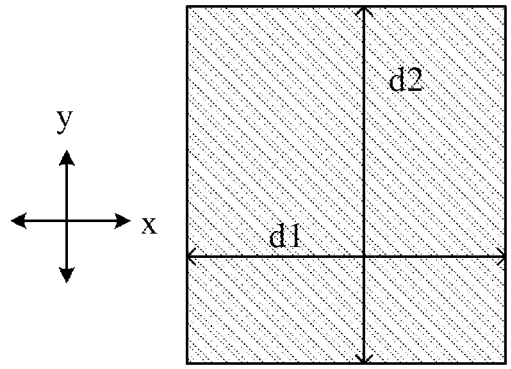
FIG. 7 is a top schematic diagram of a pad structure in a display panel according to an embodiment of the present disclosure.

In some embodiments, as shown in FIG. 6, the minimum length of the pad structure 70 in the first direction x is d1, where the first direction x is parallel to the plane of the substrate 10, and d1>5 µm. In a display panel including an array layer between the substrate 10 and the light emitting devices, the array layer including stacked metal layers and insulating layers, metal lines are disposed in the array layer, and the line width of the metal lines is typically 3-5 µm. The pad structure 70 in this embodiment has a length in the first direction x that is greater than a line width of a conventional metal line. FIG. 7 schematically shows a top view of a pad structure in a display panel according to another embodiment of the disclosure. A minimum length of the pad structure 70 in the first direction x is d1, a minimum length of the pad structure 70 in the second direction y is d2, d1>5 µm, and d2>5 µm. The first direction x and the second direction y are parallel to the plane of the substrate 10. In contrast to conventional metal lines in a display panel, the pad structure 70 may be regarded as a bulk structure with a certain area, the size is relatively large, the pad structure 70 is not easily planarized by a film layer in an array layer, and thus the first portion 21 can be padded by the pad structure 70.

In some embodiments, d1≥10 µm and d2≥10 µm. The area of the pad structure 70 is at least 100 µm². In this embodiment, the pad structure 70 has a large area, and neither the inorganic layer nor the organic layer formed after the process of the pad structure 70 can planarize the pad structure 70 such that the pad structure 70 is located on a region forming a protrusion. The height of the first portion 21 can be increased when the pad structure 70 is stacked away from the side of the substrate 10, so that the vertical distance between the surface of the part of the first portion 21 away from the side of the substrate 10 and the substrate 10 is greater than the vertical distance between the surface of the second portion 22 away from the side of the substrate 10 and the substrate 10.

Figure 8:
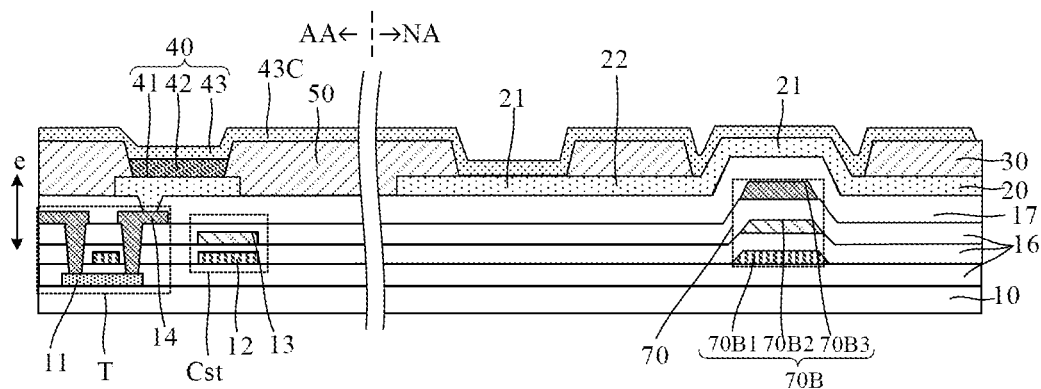
FIG. 8 is another schematic diagram of a display panel according to an embodiment of the present disclosure.

In some embodiments, as shown in FIG. 8, the display panel includes a semiconductor layer 11 at a side of a substrate 10, a first metal layer 12, a second metal layer 13, a third metal layer 14, and an insulating layer disposed between the semiconductor layer 11 and the first metal layer 12 and between other adjacent metal layers. The display panel includes an array layer 80 at a side of a substrate 10, the array layer 80 including a pixel circuit including a transistor T and a storage capacitor Cst. The active layer of the transistor T is located on the semiconductor layer 11, the gate of the transistor T is located on the first metal layer 12, and the source and drain of the transistor are in the third metal layer 14. One plate of the storage capacitor Cst is located on the first metal layer 12 and the other plate is located on the second metal layer 13. The display panel includes at least data lines, scan lines, light-emitting control lines, reset signal lines, and power signal lines. The data lines, scan lines, emission control lines, reset lines, and power lines are disposed in the first metal layer 12, the second metal layer 13, and the third metal layer 14, respectively.

As shown in FIG. 8, the insulating layers between the semiconductor layer 11 and the first metal layer 12, the first metal layer 12 and the second metal layer 13, and the second metal layer 13 and the third metal layer 14 include inorganic insulating layers 16. The insulating layer between the third metal layer 14 and the metal structure 20 includes an organic insulating layer 17. Referring to the above description in the embodiment of FIG. 7, in the embodiment of the present disclosure, the pad structure 70 has a larger area, that is, each pad portion 70B has a larger area, and neither the inorganic layer nor the organic layer formed after the processing of the pad portion 70B can planarize the pad portion 70B, such that the finally formed pad structure 70 is located on a region forming a raised structure, and the height of the first portion 21 can be padded when the pad structure 70 is stacked on the side away from the substrate 10, so that the vertical distance between the surface of the first portion 21 away from the side of the substrate 10 and the substrate 10 is greater than the vertical distance between the surface of the second portion 22 away from the side of the substrate 10 and the substrate 10.

Figure 9:
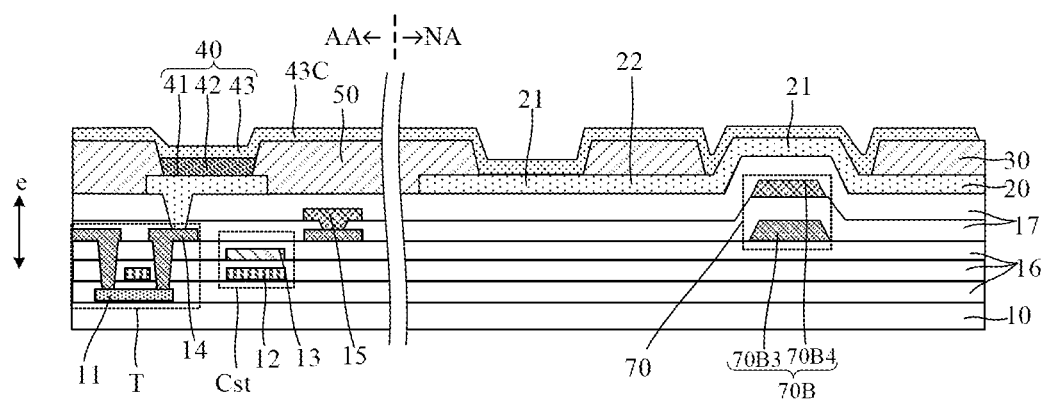
FIG. 9 is another schematic diagram of a display panel according to an embodiment of the present disclosure.

In another embodiment, FIG. 9 is a schematic diagram of another display panel provided by the embodiment of the present disclosure. As shown in FIG. 9, the display panel includes a semiconductor layer 11, a first metal layer 12, a second metal layer 13, a third metal layer 14, and a fourth metal layer 15 that are located at a side of the substrate 10, with insulating layers disposed between the semiconductor layer 11 and the first metal layer 12, and between other adjacent metal layers. The active layer of the transistor T is located on the semiconductor layer 11, the gate of the transistor T is located on the first metal layer 12, and the source and drain of the transistor are in the third metal layer 14. One plate of the storage capacitor Cst is located on the first metal layer 12 and the other plate is located on the second metal layer 13. The display panel includes at least data lines, scan lines, light-emitting control lines, reset signal lines, and power signal lines. The data lines, scan lines, emission control lines, reset lines, and power lines are disposed in the first metal layer 12, the second metal layer 13, the third metal layer 14, and the fourth metal layer 15, respectively.

As shown in FIG. 9, the insulating layers between the semiconductor layer 11 and the first metal layer 12, the first metal layer 12 and the second metal layer 13, and the second metal layer 13 and the third metal layer 14 include inorganic insulating layers 16. The insulating layer between the third metal layer 14 and the fourth metal layer 15, and the insulating layer between the fourth metal layer 15 and the metal structure 20 include an organic insulating layer 17. In the embodiment of the present disclosure, the pad structure 70 has a relatively larger area, that is, each pad portion 70B has a relatively large area. Neither the inorganic layer nor the organic layer formed after the treatment of the pad portion 70B can planarize the pad portion 70B. In this way, the finally formed pad structure 70 is located on a region forming a convex structure, and the height of the first portion 21 can be padded when the pad structure 70 is stacked away from the side of the substrate 10. The vertical distance between the surface of the part of the first portion 21 away from the side of the substrate 10 and the substrate 10 is greater than the vertical distance between the surface of the second portion 22 away from the side of the substrate 10 and the substrate 10.

In the embodiment of the present disclosure, the pad structure 70 includes at least one pad portion. The at least one pad portion is disposed on the semiconductor layer 11, and/or the at least one pad portion is disposed on at least one metal layer. In some embodiments, the pad structure 70 includes a pad portion in the semiconductor layer 11 or any metal layer. In other embodiments, the pad structure 70 includes two or more of pad portions in a semiconductor layer or a metal layer, respectively. Embodiments of the present disclosure utilize existing layers of film in a display panel to form the pad structure 70 without adding a new process, which simplifies process costs.

In one embodiment, as shown in FIG. 8, the pad portion 70B includes a first pad portion 70B1 located on the first metal layer 12, a second pad portion 70B2 located on the second metal layer 13, and a third pad portion 70B3 located on the third metal layer 14. The first pad portion 70B1, the second pad portion 70B2, and the third pad portion 70B3 overlap with each other in the direction e perpendicular to the plane of the substrate 10, and adjacent two of the pad portions are spaced by an insulating layer 70B. In this embodiment, the pad structure 70 is made by using three metal layers in the display panel, and the three stacked pad portions 70B can make the entire the pad structure 70 thicker, and the height of the first portion 21 can be padded up when the pad structure 70 stacks the first portion 21 away from the side of the substrate 10. In this way, the vertical distance between the surface of the part of the first portion 21 away from the side of the substrate 10 and the substrate 10 is larger than the vertical distance between the surface of the second portion 22 away from the side of the substrate 10 and the substrate 10.

In another embodiment, as shown in FIG. 9, the pad portion 70B includes a third pad portion 70B3 located on the third metal layer 14 and a fourth pad portion 70B4 located on the fourth metal layer 15 overlapping with the third pad portion 70B3 in the direction e perpendicular to the plane of the substrate 10. Alternatively, the first metal layer 12 and the second metal layer 13 are made of a same material, the third metal layer 14 and the fourth metal layer 15 are made of a same material, and the thickness of the third metal layer 14 and the fourth metal layer 15 is greater than the thickness of the first metal layer 12 and the second metal layer 13. In one embodiment, the third metal layer 14 and the fourth metal layer 15 are made of materials including metallic titanium and metallic aluminum. The three-layer stacked structure of the titanium/aluminum/titanium of the third metal layer 14 and the fourth metal layer 15. The thickness of the third metal layer 14 and the fourth metal layer 15 is about 0.8 µm, and the film under the first portion 21 can be thickened by about 1.6 µm after the fourth pad portion 70B4 and the third pad portion 70B3 are stacked. The first portion 21 padded by the pad structure 70 in this embodiment can reach a height substantially level with the first insulating layer 30, so as to reduce the vertical distance between a part of the first portion 21 and the mask during the evaporation process, so that the capacitance formed by the overlap of the mask and the metal structure 20 is increased, so that the amount of charge that the capacitance can store is increased, and ESD damage to the metal structure 20 can be prevented.

Figure 10:
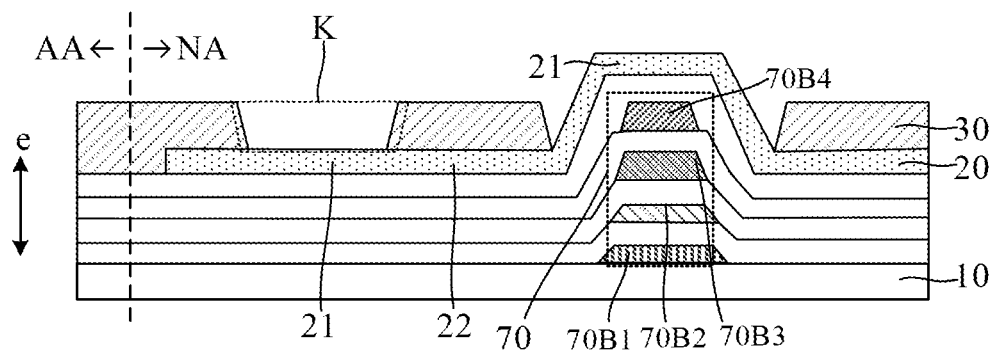
FIG. 10 is another schematic diagram of a display panel according to an embodiment of the present disclosure.

In another embodiment, FIG. 10 illustrates another display panel according to an embodiment of the present disclosure. As shown in FIG. 10, the pad structure 70 includes a first pad portion 70B1 located on the first metal layer 12, a second pad portion 70B2 located on the second metal layer 13, a third pad portion 70B3 located on the third metal layer 14, and a fourth pad portion 70B4 located on the fourth metal layer 15. The fourth pad portion 70B4 overlaps each of the first pad portion 70B1, the second pad portion 70B2, and the third pad portion 70B3 in the direction perpendicular to the plane of the substrate 10. The use of four metal layers to form the pad structure 70 in this embodiment enables the height of the pad structure 70 to be greater than the height of the first insulating layer 30, that is, the first distance h1 is greater than the third distance h3 in the embodiment of FIG. 3 described above. In this embodiment, the level of the part of the first portion 21 is padded by the pad structure 70, the part of the first portion 21 padded by the pad structure 70 can be in contact with the mask during the evaporation process, and the first insulating layer 30 with a smaller level is not in contact with the mask, which shows that the metal film layer in the panel is in contact with the mask made of metal material. In one aspect, the contact area between the non-metal film layer and the mask in the panel to be evaporated can be reduced, and the static electricity generated by separating the mask from the panel to be evaporated can be reduced. On the other hand, the first portion 21 with the larger height is in contact with the mask, and the static electricity on the metal structure 20 can be introduced onto the mask through the first portion 21 in contact with the mask, thereby guiding the static electricity on the panel away and preventing the large accumulation of static charges on the panel, which can also reduce the risk of static discharge in the evaporation process.

In conjunction with the above embodiment of FIG. 4, in the display panel where the non-display region NA includes the first support column 61, the pad structure 70 can be made by using at least four metal layers according to the design of the embodiment of the present disclosure to achieve the height of the pad structure 70 close to the height of the first support column 61, and the first portion 21 padded by the evaporation process can be in contact with the mask to substantially reduce ESD damage during the evaporation process.

In one embodiment, the first metal layer 12 and the second metal layer 13 each have a thickness of about 0.3 μm, the third metal layer 14 and the fourth metal layer 15 each have a thickness of about 0.8 μm, and the pad structure 70 can be formed using four metal layers to pad at least the first portion 21 by 2.3 μm.

Figure 11:
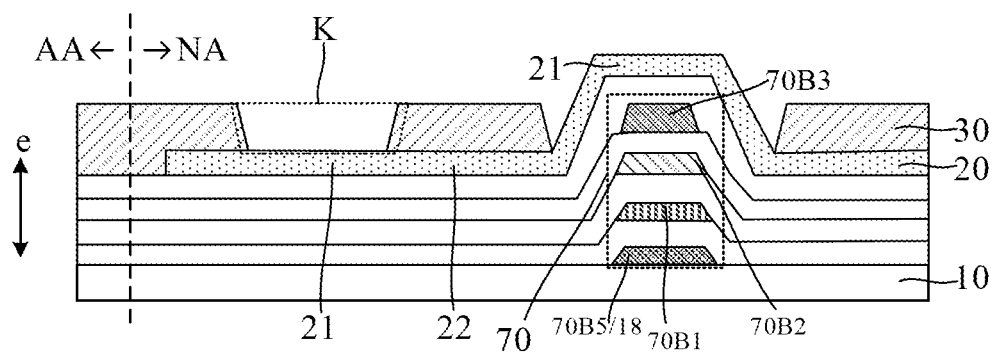
FIG. 11 is another schematic diagram of a display panel according to an embodiment of the present disclosure.

In another embodiment, as shown in FIG. 11, the display panel further includes a light-shielding layer 18 disposed between the semiconductor layer 11 and the substrate 10, and the light-shielding layer 18 disposed in the display region AA is used for shielding the active layer of the transistor to ensure the stability of the transistor. The pad portion includes a fifth pad portion 70B5 in the light-shielding layer 18; the fifth pad portion 70B5 overlaps the first pad portion 70B1, the second pad portion 70B2, and the third pad portion 70B3 in the direction e perpendicular to the plane of the substrate 10. In this embodiment, the light-shielding layer 18 is also used to form a pad, which increases the thickness of the entire pad structure 70 and further increases the height of the first portion 21.

In another embodiment, the pad portion includes a sixth pad portion in the semiconductor layer; the sixth pad portion overlaps each of the first pad portion 70B1, the second pad portion 70B2, and the third pad portion 70B3 in the direction e perpendicular to the plane of the substrate 10, and is not illustrated herein.

Figure 12:
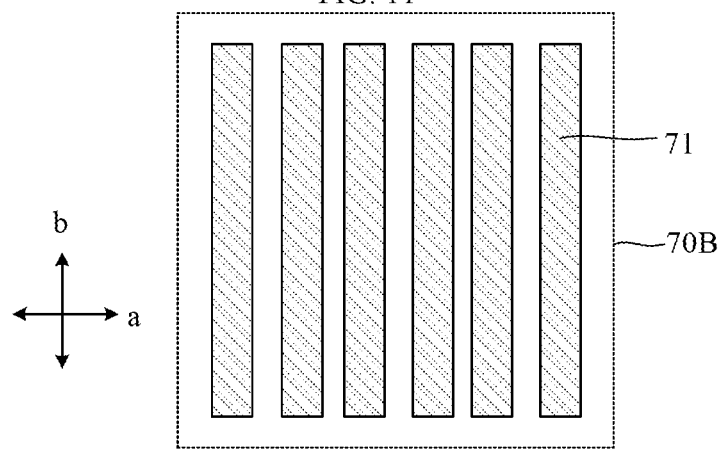
FIG. 12 is another schematic top view of a pad structure of a display panel according to an embodiment of the present disclosure.

In another embodiment, FIG. 12 is another schematic top view of a pad structure in a display panel according to another embodiment of the present disclosure, the pad structure 70 including a pad portion 70B, as shown in FIG. 12, at least one of the pad portions 70B including at least two strip structures 71 extending in a third direction a and arranged in a fourth direction b, the third direction a and the fourth direction b intersecting each other. In this embodiment, by setting the width of the strip structure 71 in the fourth direction b and the spacing distance between adjacent strip structures 71 to achieve a close arrangement of the strip structures 71, an undulating surface can be formed when the insulating layer is formed on the pad portion 70B of the strip structures 71, and the position of the strip structures 71 is not planarized, thereby serving to pad the first portion 21.

Figure 13:
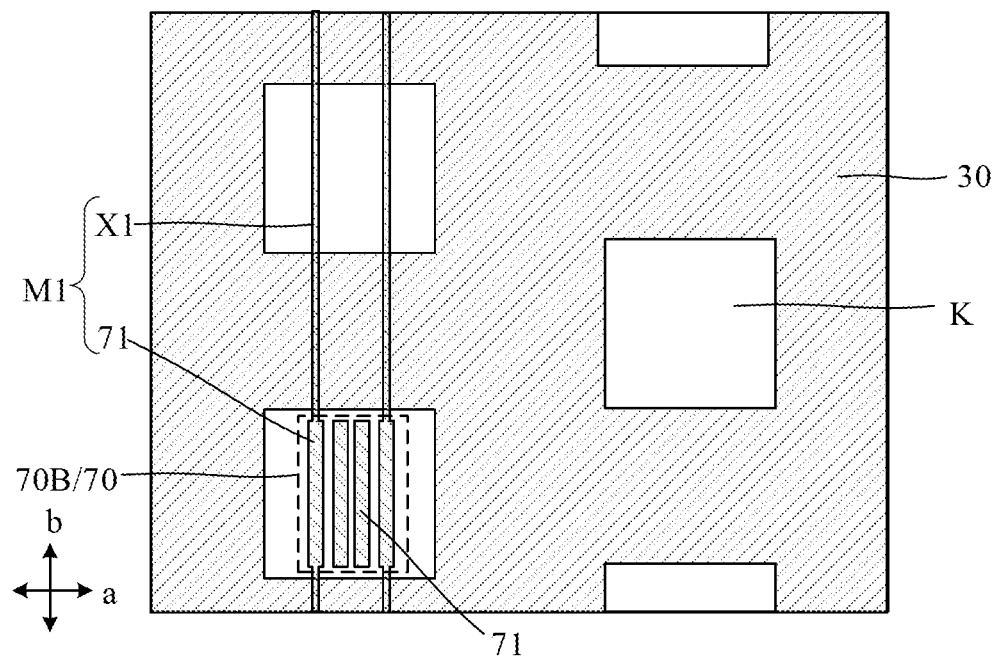
FIG. 13 is a schematic top view of a display panel according to an embodiment of the present disclosure.

In another embodiment, FIG. 13 is a schematic top view of a display panel provided by the embodiment of the present disclosure. FIG. 13 only illustrates a partial area within the non-display region NA. As shown in FIG. 13, the display panel includes a first metal line M1 including a strip structure 71 and a first line segment X1 directly connected to the strip structure 71. It can be seen that a width of the strip structure 71 in the fourth direction b is greater than a line width of the first line segment X1. For clarity in illustrating the structure of the first metal line M1, the metal structure 20 is not shown in FIG. 13. Using the first metal layer M1 to form the stripe structure 71 in the pad portion 70 in this embodiment, the routing of the first metal line M1 does not need to avoid the predetermined position of the pad structure 70, but only the line width of the part of the first metal line M1 can be increased to ensure that the stripe structures 71 formed at that position are not planarized by the insulating layer.

Optionally, at least a part of the first line segment X1 overlaps the first insulating layer 30 in a direction perpendicular to the plane of the substrate 10. While the line width of the overlapping part of the first metal line M1 with the first insulating layer 30 is still small, the surface of the first metal line M1 after forming the insulating layer over a part of the first line segment X does not form a large undulation.

Figure 14:
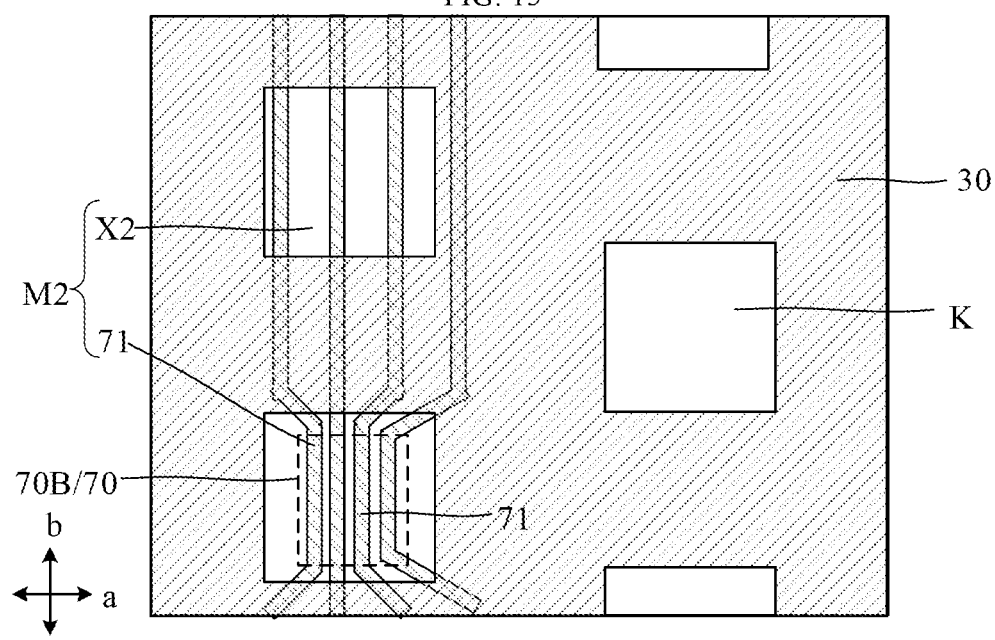
FIG. 14 is another schematic top view of a display panel according to an embodiment of the present disclosure.

In another embodiment, FIG. 14 is another schematic top view of a display panel provided by the embodiment of the present disclosure, where FIG. 14 only illustrates a partial area within the non-display region NA, as shown in FIG. 13, the display panel includes a second metal line M2 including a strip structure 71 and a second line segment X2 directly connected to the strip structure 71; where a distance between two adjacent strip structures 71 is smaller than a distance between two adjacent second line segments X2. For clarity in illustrating the structure of the second metal line M2, the metal structure 20 is not shown in FIG. 14. Using the second metal lines M2 to form the stripe structures 71 in the pad portion 70 in this embodiment, the routing of the second metal lines M2 at the time of forming does not need to avoid the position of the predetermined pad structure 70, but only the distance of the second metal lines M2 provided at the position of the predetermined pad structure 70 may be reduced without ensuring a short circuit, that is, a local area of the second metal lines M2 is densely arranged to form the pad portion 70B, such that the densely arranged second metal lines M2 provided at the position are guaranteed not to be planarized by the insulating layer.

Figure 15:
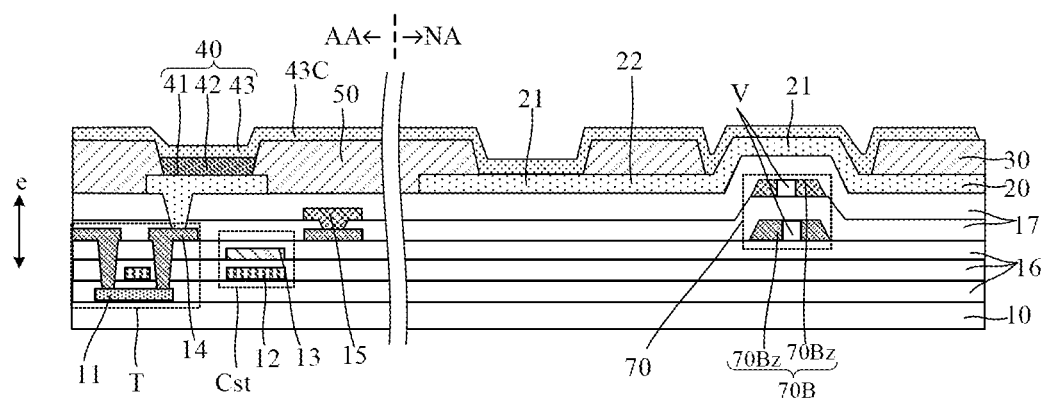
FIG. 15 is another schematic diagram of a display panel according to an embodiment of the present disclosure.

In another embodiment, FIG. 15 is a schematic diagram of another display panel provided in the embodiment of the present disclosure. As shown in FIG. 15, the display panel includes an organic insulating layer 17 at a side of the substrate 10; the pad portion 70B includes a subpad portion 70Bz in contact with the organic insulating layer 17, and the subpad portion 70Bz has at least one opening V; the opening V penetrates the subpad portion 70Bz in the direction e perpendicular to the plane of the substrate 10. In the fabrication process of the display panel, gas is generated in the organic insulating layer 17 during high temperature process, and the gas is not discharged to cause deformation or cracking of the film structure. The opening V is formed in the pad portion 70Bz, and the opening V can serve as a path for the gas to be exhausted, and the gas released from the organic insulating layer 17 during the high temperature process can be smoothly exhausted, thereby preventing the deformation or cracking of the membrane layer structure and improving the stability of the module structure.

In one embodiment, the insulating layer between the third metal layer 14 and the fourth metal layer 15 includes an organic insulating layer 17, and when the pad portion 70B includes a third pad portion 70B3 on the third metal layer 14, the third pad portion 70B3 is a subpad portion 70Bz, and the third pad portion 70B3 is provided with at least one opening V.

In one embodiment, the insulating layer between the fourth metal layer 15 and the metal structure 20 includes an organic insulating layer 17, and when the pad portion 70B includes the fourth pad portion 70B4 of the fourth metal layer 15, the fourth pad portion 70B4 is a sub pad portion 70Bz, and the fourth pad portion 70B4 is provided with at least one opening V.

Figure 16:
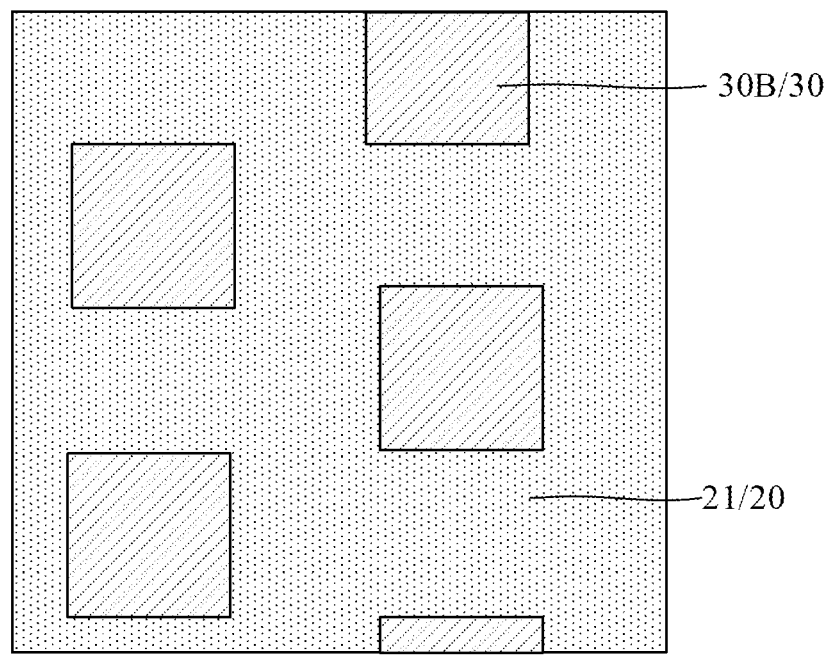
FIG. 16 is another schematic diagram of a display panel according to an embodiment of the present disclosure.

In another embodiment, FIG. 16 is a schematic diagram of the non-display region NA, where a plurality of isolated insulating portions 30B is shown. At the position of the metal structure 20, the portion other than the insulating portion 30B in the plane of the first insulating layer 30 is a hollow region, and it can be seen that the hollow region surrounds the insulating portion 30B. As understood in conjunction with the embodiment of FIG. 2, the common electrode 43C extends from the display region AA to the non-display region NA, and the common electrode 43C in the hollow region is in contact with the first portion 21.

Figure 17:
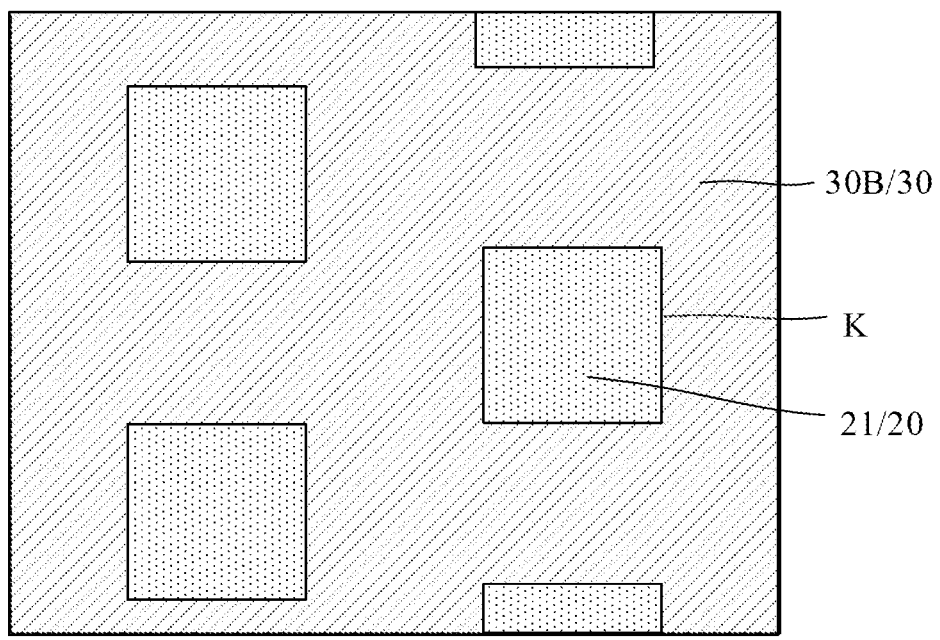
FIG. 17 is another schematic diagram of a display panel according to an embodiment of the present disclosure.

In another embodiment, FIG. 17 illustrates another display panel according to an embodiment of the present disclosure, and FIG. 17 illustrates a partial location of the non-display region NA. As shown in FIG. 17, the first insulating layer 30 includes a plurality of mutually isolated hollow regions K, and the parts of the first insulating layer 30 other than the hollow regions K are insulating portions 30B surrounding the hollow regions K. As understood in conjunction with the embodiment of FIG. 2, the common electrode 43C extends from the display region AA to the non-display region NA, and the common electrode 43C in the hollow region K is in contact with the first portion 21.

Figure 18:
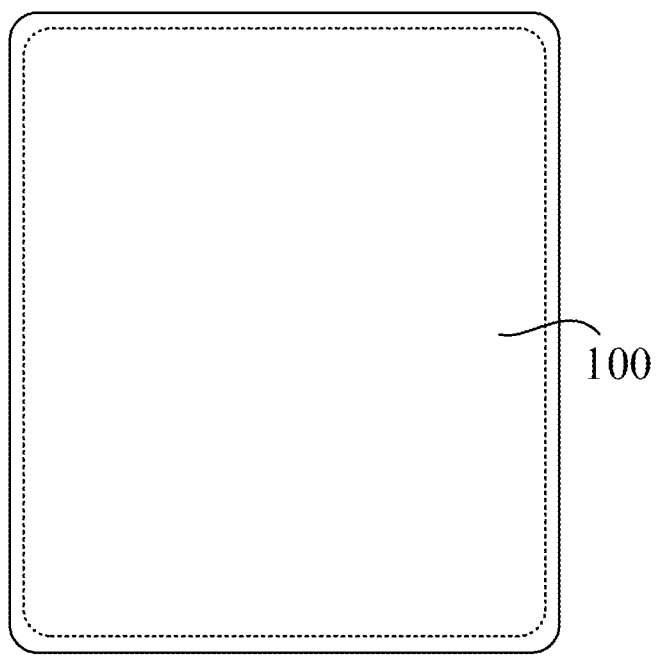
FIG. 18 is a schematic diagram of a display device according to an embodiment of the present disclosure.

According to the same inventive concept, the embodiment of the present disclosure further provides a display device. FIG. 18 is a schematic diagram of the display device provided by the embodiment of the present disclosure, and as shown in FIG. 18, the display device includes a display panel 100 provided by any of the embodiment of the present disclosures. The structure of the display panel 100 is described in the above embodiments, and is not repeated herein. Embodiments of the present disclosure provide a display device such as a mobile phone, a tablet computer, a laptop computer, a television, and the like.

The above description merely illustrates some embodiments of the present disclosure, and is not intended to limit the present disclosure. Any modifications, equivalent replacements, improvements, and the like made within the principle of the present disclosure shall fall within the protection scope of the present disclosure.

Finally, it should be noted that the foregoing embodiments are merely intended to describe and not to limit the technical solutions of the present disclosure. Although the present disclosure has been described in detail with reference to the foregoing embodiments, persons skilled in the art should understand that they can still make modifications to the technical solutions described in the foregoing embodiments or make equivalent replacements to some or all of the technical features thereof. These modifications or replacements do not make the essence of the corresponding technical solutions deviate from the scope of the technical solutions of the embodiments of the present disclosure.

What is claimed is:

1. A display panel, comprising:
   a display region;
   a non-display region;
   a substrate;
   a metal structure at a side of the substrate, and
   a first insulating layer, wherein the metal structure and the first insulating layer are located on the non-display region, and the first insulating layer is located at a side of the metal structure away from the substrate;
   wherein the first insulating layer has a hollow region penetrating the first insulating layer in a direction perpendicular to a plane of the substrate, the metal structure comprises a first portion and a second portion that are connected to each other, and in the direction perpendicular to the plane of the substrate, the first portion overlaps the hollow region and the second portion overlaps the first insulating layer, and
   further wherein a maximum distance between a surface of a side of at least part of the first portion away from of the substrate and the substrate is a first distance, a maximum distance between a surface of a side of the second portion away from the substrate and the substrate is a second distance in the direction perpendicular to the plane of the substrate, and the first distance is greater than the second distance.

2. The display panel according to claim 1, wherein the display region comprises:
   light emitting devices and pixel defining layers located at a side of the substrate, wherein the pixel defining layers are configured to separate two of the light emitting devices and wherein the two light emitting devices are adjacent,
   and further wherein the light emitting devices each comprise a first electrode, a light emitting layer, and a second electrode that are stacked, and wherein the second electrodes of the light emitting devices are interconnected to form a common electrode,
   wherein the common electrode extends from the display region to the non-display region, and the common electrode in the hollow region is in contact with the first portion.

3. The display panel according to claim 2, wherein the metal structure is disposed in a same layer as the first electrode.

4. The display panel according to claim 1, wherein a maximum distance between a surface of a side of the first insulating layer away from the substrate and the substrate is a third distance in the direction perpendicular to the plane of the substrate; and the first distance is greater than the third distance.

5. The display panel according to claim 1, wherein the non-display region comprises a first support column located at a side of the first insulating layer away from the substrate, and the first support column is in contact with the first insulating layer.

6. The display panel according to claim 5, wherein the display region comprises:
   a pixel defining layer at a side of the substrate;
   a second support column at a side of the pixel defining layer away from the substrate; and
   wherein a height of the first support column is less than a height of the second support column in the direction perpendicular to the plane of the substrate.

7. The display panel according to claim 1, wherein the non-display region further comprises a pad structure between the substrate and the metal structure, wherein at least part of the first portion overlaps the pad structure in the direction perpendicular to the plane of the substrate, and an orthographic projection of the part of the first portion on the substrate covers an orthographic projection of the pad structure on the substrate.

8. The display panel according to claim 7, wherein the pad structure does not overlap with the first insulating layer in the direction perpendicular to the plane of the substrate.

9. The display panel according to claim 7, wherein a minimum length of the pad structure in a first direction is d1, a minimum length of the pad structure in a second direction is d2, the first direction and the second direction are perpendicular to each other, and the first direction and the second direction are both parallel to the plane of the substrate, wherein d1>5 μm, and d2>5 μm.

10. The display panel according to claim 9, wherein d1≥10 μm and d2≥10 μm.

11. The display panel according to claim 7, wherein the display panel comprises a semiconductor layer and metal layers that are located at a side of the substrate, wherein the pad structure comprises at least one pad portion; and the at least one pad portion is located on the semiconductor layer, and/or the at least one pad portion is located on at least one of the metal layers.

12. The display panel according to claim 11, wherein the metal layers comprise a first metal layer, a second metal layer, and a third metal layer that are located at a side of the semiconductor layer away from the substrate and sequentially away from the semiconductor layer;
the at least one pad portion comprises a first pad portion in the first metal layer, a second pad portion in the second metal layer, and a third pad portion in the third metal layer; and
the first pad portion, the second pad portion, and the third pad portion overlap each other in the direction perpendicular to the plane of the substrate, and adjacent two pad portions are spaced by an insulating layer.

13. The display panel according to claim 11, wherein the metal layers further comprise a fourth metal layer at a side of the third metal layer away from the substrate, and the at least one pad portion comprises a fourth pad portion located in the fourth metal layer and the fourth pad portion overlaps the first pad portion, the second pad portion, and the third pad portion in the direction perpendicular to the plane of the substrate.

14. The display panel according to claim 11, wherein the metal layers comprise a light-shielding layer disposed between the semiconductor layer and the substrate; the at least one pad portion comprises a fifth pad portion disposed on the light-shielding layer;
the fifth pad portion overlaps the first pad portion, the second pad portion, and the third pad portion in the direction perpendicular to the plane of the substrate; and/or
the at least one pad portion comprises a sixth pad portion in the semiconductor layer; the sixth pad portion overlaps the first pad portion, the second pad portion, and the third pad portion in the direction perpendicular to the plane of the substrate.

15. The display panel according to claim 11, wherein the metal layers comprise a first metal layer, a second metal layer, a third metal layer, and a fourth metal layer that are located at a side of the semiconductor layer away from the substrate and sequentially away from the semiconductor layer;
the third metal layer and the fourth metal layer are made of a same material, and the first metal layer and the second metal layer are made of a same material; and
the at least one pad portion comprises a third pad portion in the third metal layer and a fourth pad portion in the fourth metal layer; and the third pad portion overlaps the fourth pad portion in a direction perpendicular to a plane of the substrate.

16. The display panel according to claim 11, wherein the at least one pad portion comprises at least two strip structures extending in a third direction and arranged in a fourth direction, and the third direction and the fourth direction are interdigitated.

17. The display panel according to claim 16, wherein the display panel further comprises first metal lines, wherein the first metal lines comprise the stripe structures and first line segments directly connected to the stripe structures, and a width of each of the stripe structures in the fourth direction is greater than a line width of each of the first line segments.

18. The display panel according to claim 16, wherein the display panel further comprises second metal lines, wherein the second metal lines comprise the stripe structures and second line segments directly connected to the stripe structure, and a distance between adjacent two of the stripe structures is less than a distance between adjacent two of the second line segments.

19. The display panel according to claim 11, wherein the display panel further comprises an organic insulating layer located at a side of the substrate; and
the pad portion comprises a subpad portion in contact with the organic insulating layer, the subpad portion has at least one opening, and the opening penetrates through the subpad portion in the direction perpendicular to the plane of the substrate.

20. The display panel according to claim 1, wherein the first insulating layer comprises mutually isolated insulating portions, and the hollow region surrounds the insulating portions.

21. The display panel according to claim 1, wherein the first insulating layer comprises a plurality of mutually isolated hollow regions, a part of the first insulating layer other than the hollow regions is defined as an insulating portion, and the insulating portion surrounds the hollow regions.

22. A display device, comprising a display panel, comprising:
a display region;
a non-display region;
a substrate; and
a metal structure at a side of the substrate, and a first insulating layer, wherein the metal structure and the first insulating layer are located on the non-display region, and the first insulating layer is located at a side of the metal structure away from the substrate,
further wherein the first insulating layer has a hollow region penetrating the first insulating layer in a direction perpendicular to a plane of the substrate; the metal structure comprises a first portion and a second portion that are connected to each other; and in the direction perpendicular to the plane of the substrate, the first portion overlaps the hollow region and the second portion overlaps the first insulating layer, and
wherein a maximum distance between a surface of a side of at least part of the first portion away from of the substrate and the substrate is a first distance in the direction perpendicular to the plane of the substrate, a maximum distance between a surface of a side of the second portion away from the substrate and the substrate is a second distance, and the first distance is greater than the second distance.

* * * * *